United States Patent
Shih et al.

(10) Patent No.: US 6,593,645 B2
(45) Date of Patent: Jul. 15, 2003

(54) THREE-DIMENSIONAL SYSTEM-ON-CHIP STRUCTURE

(75) Inventors: Chian-Gauh Shih, Hsinchu Hsien (TW); Hsin-Pang Lu, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 58 days.

(21) Appl. No.: 09/797,542

(22) Filed: Mar. 1, 2001

(65) Prior Publication Data

US 2001/0006257 A1 Jul. 5, 2001

Related U.S. Application Data

(62) Division of application No. 09/405,456, filed on Sep. 24, 1999, now abandoned.

(51) Int. Cl.[7] .......................... H01L 23/02; H01L 23/48
(52) U.S. Cl. ................. 257/686; 257/723; 257/774; 257/777
(58) Field of Search ................. 257/686, 723, 257/774, 777

(56) References Cited

U.S. PATENT DOCUMENTS

| | | | | |
|---|---|---|---|---|
| 4,612,083 A | * | 9/1986 | Yasumoto et al. | 438/59 |
| 4,939,568 A | * | 7/1990 | Kato et al. | 257/723 |
| 5,138,437 A | * | 8/1992 | Kumamoto et al. | 257/686 |
| 5,191,405 A | * | 3/1993 | Tomita et al. | 257/777 |
| 5,202,754 A | * | 4/1993 | Bertin et al. | 257/684 |
| 5,239,448 A | * | 8/1993 | Perkins et al. | 257/686 |
| 5,266,511 A | * | 11/1993 | Takao | 438/401 |
| 5,380,681 A | * | 1/1995 | Hsu | 438/109 |
| 5,489,554 A | * | 2/1996 | Gates | 438/59 |
| 5,579,207 A | * | 11/1996 | Hayden et al. | 257/786 |

* cited by examiner

Primary Examiner—Matthew Smith
Assistant Examiner—Lex H. Malsawma

(57) ABSTRACT

A three-dimensional system-on-chip structure comprises a plurality of chips and a plurality of plugs respectively fabricated in the chips. The chips are stacked on top of each other and each includes a periphery circuitry region. A plurality of contact pads is fabricated in each of the periphery circuitry regions. The plugs are formed in the corresponding stacked chips, and are electrically connected to the corresponding contact pads of two of the corresponding chips which are adjacent to each other, or two of the corresponding chips which are not adjacent to each other.

18 Claims, 3 Drawing Sheets

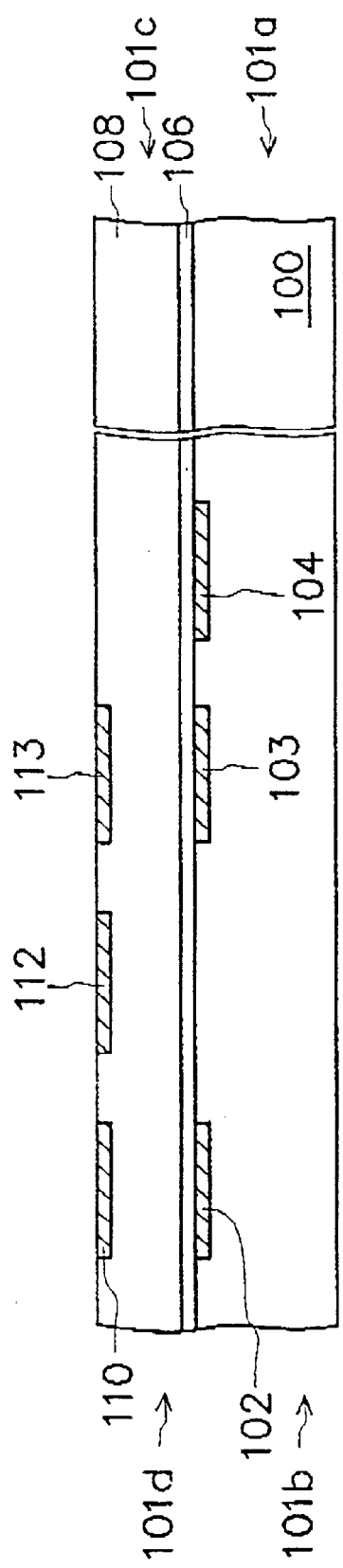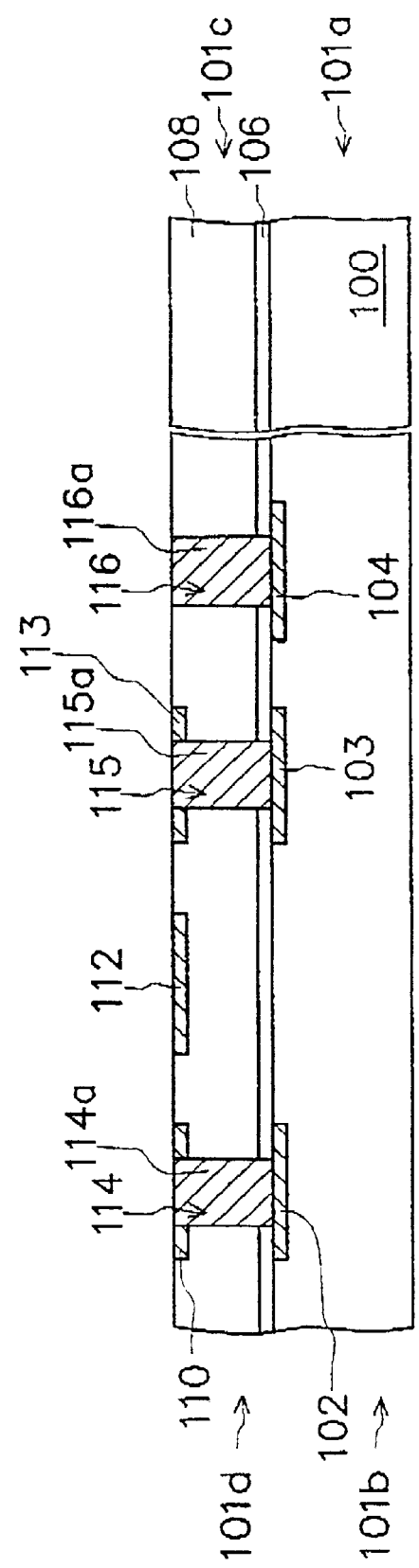

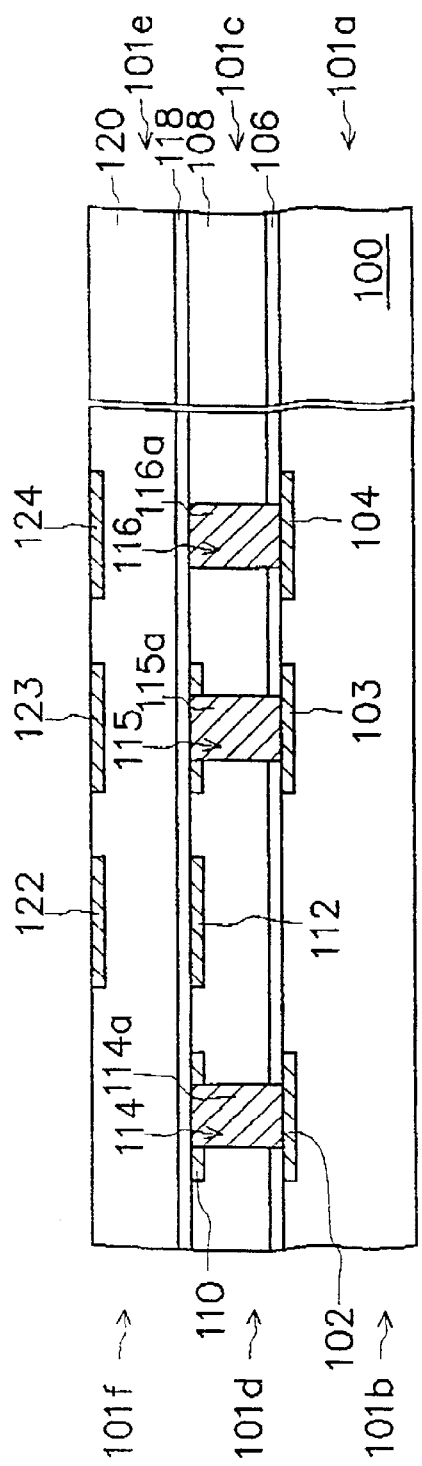
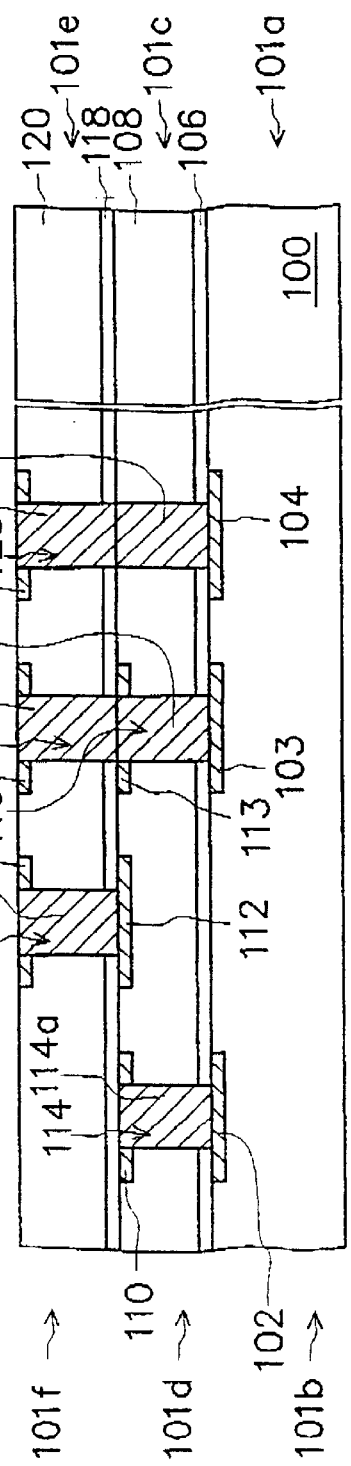
FIG. 1C
FIG. 1D

THREE-DIMENSIONAL SYSTEM-ON-CHIP STRUCTURE

CROSS-REFERENCE TO RELATED APPLICATION

This application is a divisional application of, and claim the priority benefit of, U.S. application serial No. 09/405,456 filed on Sep. 24, 1999, now abandoned.

BACKGROUND OF THE INVENTION

1. Field of the Invention

The present invention relates to a method of fabricating a system-on-chip and its structure. More particularly, the present invention relates to a method of fabricating a three-dimensional system-on-chip and its structure.

2. Description of Related Art

Due to competition in the market, embedding different integrated circuits such as ROMs, SRAMs, Flash memories, DRAMs, Logics, Digital circuits, and so on in a single chip is the current trend for manufacturing integrated circuits that are lightweight, small in size, and multi-functional, as required. This is called the system-on-chip (SOC). For example, embedded Flash memory is a circuit with a Flash memory and a Logic.

However, fabrication of DRAMs, Flash memories, Logics, radio frequency (RF) elements, etc. on a single chip makes the circuit layout design, which connects circuits to each other, relatively complicated. Moreover, manufacturing processes for elements having different functions are not the same; the complexity and the difficulty for fabrication of the system-on-chip, which has to integrate elements having different function on a single chip, are greatly increased. Therefore, the yield of the product is decreased and production cost is increased.

SUMMARY OF THE INVENTION

It is therefore an objective of the present invention to provide a method of fabricating a three-dimensional system-on-chip. The method is described as follows. A first chip having a periphery circuitry region is provided, with a plurality of first contact pads formed in a surface of the periphery circuitry region. A second chip is then adhered on the first chip. The second chip includes a periphery circuitry region, with a plurality of second contact pads formed in a surface of the periphery circuitry region. Some of the second contact pads are aligned with some of the first contact pads. A plurality of first plugs is formed in the second chip, with some of the first plugs electrically connected to some of the first contact pads and some of the second contact pads. Then, a third chip is adhered on the second chip. The third chip includes a periphery circuitry region, with a plurality of third contact pads formed in a surface of the periphery circuitry region. Some of the third contact pads are aligned with some of the first plugs and some of the second contact pads. A plurality of second plugs is formed in the third chip, with some of the second plugs electrically connected to some of the second contact pads and some of the third contact pads. Also, some of the second plugs are electrically connected to some of the first plugs.

A three-dimensional system-on-chip structure comprises a plurality of chips and a plurality of plugs respectively fabricated in the chips. The chips are stacked on top of each other and each includes a periphery circuitry region. A plurality of contact pads is fabricated on each of the periphery circuitry regions. The plugs are formed in the corresponding stacked chips, and electrically connected to the corresponding contact pads of two of the corresponding chips which are adjacent to each other, or two of the corresponding chips which are not adjacent to each other.

Because each of the differently functioning chips is manufactured by its own manufacturing process, the complexity and the difficulty for the system-on-chip fabrication can be reduced. Therefore, the yield of the product is increased and the production cost is decreased. Moreover, a conventional interconnect process is employed for the electrical connections between the chips, the yield of fabricating the three-dimensional system-on-chip can be greatly increased. Furthermore, the differently functioning chips are not arranged on the same surface in the three-dimensional system-on-chip according to the present invention. Hence, the layout area required for the system-on-chip can be reduced. Also, the complexity and the difficulty for the circuitry layout design can be reduced. Even further, the chips are stacked on each other and connected through the plugs, so that signal transmission paths can be shortened and performance can be increased.

BRIEF DESCRIPTION OF DRAWINGS

The invention can be more fully understood by reading the following detailed description of the preferred embodiments, with reference made to the accompanying drawings, wherein:

FIGS. 1A to 1E illustrate method steps of manufacturing a three-dimensional system-on-chip in accordance with a preferred embodiment of the present invention.

DETAILED DESCRIPTION OF PREFERRED EMBODIMENTS

Figure 1E:
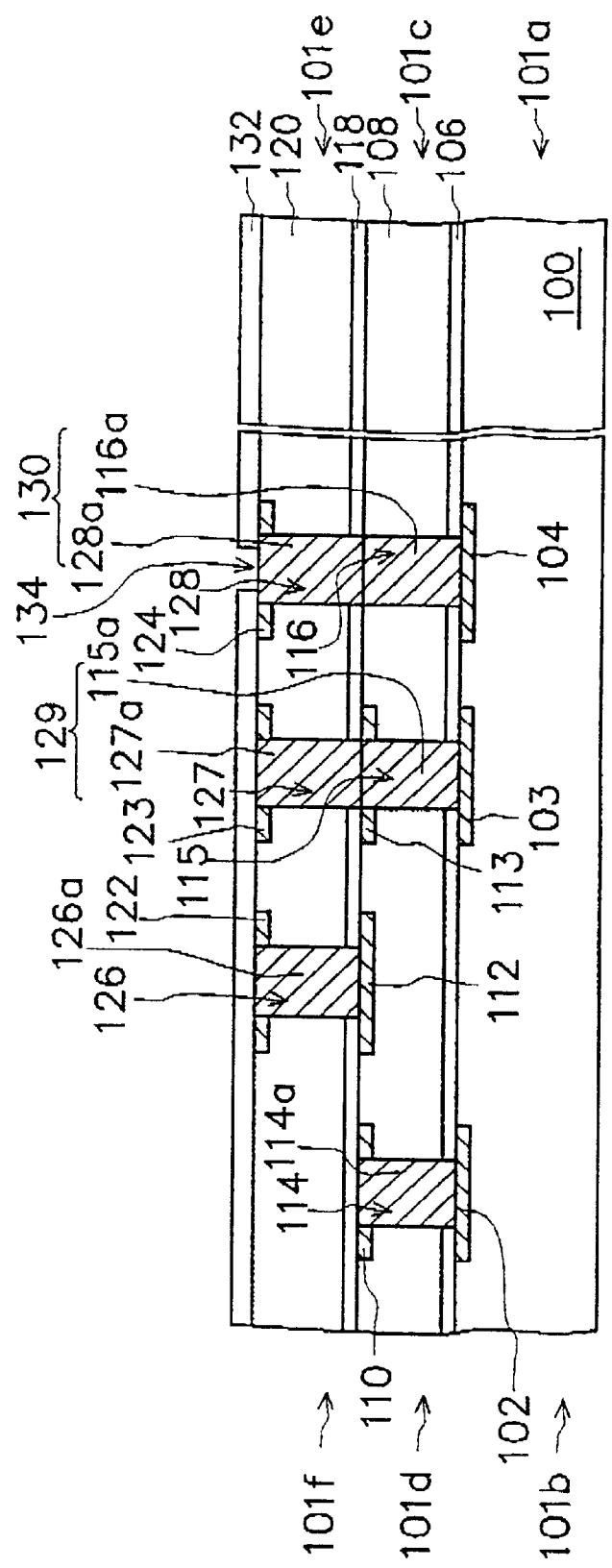

References are made to FIGS. 1A to 1E, which illustrate method steps of manufacturing a three-dimensional system-on-chip in accordance with a preferred embodiment of the present invention.

FIG. 1A shows a first chip 100 with an active circuitry region 101a on which semiconductor elements (not shown) are formed. Contact pads 102, 103, and 104 are formed on a periphery circuitry region 101b of the first chip 100. Then, after completing semiconductor element fabrication, a grinding process is performed on the first chip 100. The first chip 100 includes a DRAM, a Flash memory, a Logic, or a RF element. The contact pads 102, 103, and 104 include contact pads which are electrically connected to the semiconductor elements in the active circuitry region 101a, or contact pads which electrically connected to periphery circuitry (not shown) in the periphery circuitry region 101b. Furthermore, by means of an interconnect structure, the contact pads 102, 103, and 104 can be electrically connected to each other; either two of them or all three of them are interconnected.

An adhesive layer 106 is then formed on the first chip 100, and a second chip 108 is stacked on top of the first chip 100 by means of the adhesive layer 106. Semiconductor elements (not shown) are formed on an active circuitry region 101c of the second chip 108. Contact pads 110, 112, and 113 are formed on a periphery circuitry region 101d of the second chip 108, with the contact pads 110, 113 of the second chip 108 aligned with the contact pads 102, 103 of the first chip 100, respectively. Therein, a grinding process is performed on the second chip 108 after completing the semiconductor element fabrication. The second chip 108 includes a DRAM, a Flash memory, a Logic, or a RF element. The contact pads 110, 112, and 113 include contact pads which are electrically connected to the semiconductor elements in the active circuitry region 101c, or contact pads which are electrically connected to periphery circuitry (not shown) in the periphery circuitry region 101d. Furthermore, by means of an interconnect structure, the contact pads 110, 112, and 113 can be electrically connected to each other, either two of them or all three of them are interconnected.

Reference is made to FIG. 1B, which illustrates formation of openings 114, 115 and 116 in the second chip 108. The opening 114 is formed through the contact pad 110 and a surface of the contact pad 102 is exposed. The opening 115 is formed through the contact pad 113 and a surface of the contact pad 103 is exposed. Similarly, a surface of the contact pad 104 is exposed by the opening 116. Plugs 114a, 115a, and 116a are then formed in the openings 114, 115, and 116, respectively, and the openings 114, 115, and 116 are all filled up.

Therein, a method of manufacturing the plugs 114a, 115a, and 116a comprises formation of a conductive layer (not shown) on the second chip 108 and filling the openings 114, 115, and 116. By means of etching back or chemical-mechanical polishing (CMP), part of the conductive layer is removed until a surface of the second chip 108 is exposed. Hence, the plugs 114a, 115a, and 116a are then formed in the openings 114, 115, and 116, respectively. At this time, the contact pads 102, 103 are electrically connected to the contact pads 110, 113 through the plugs 114a, 115a, respectively.

In other words, the semiconductor elements (not shown) or the periphery circuitry of the first chip 100 can be electrically connected to the semiconductor elements (not shown) or the periphery circuitry of the second chip 108 by means of the plug 114a or 115a.

Reference is made to FIG. 1C. An adhesive layer 118 is formed on the second chip 108, and a third chip 120 is then stacked on top of the second chip 108 by means of the adhesive layer 118. Semiconductor elements (not shown) are formed in an active circuitry region 101e of the third chip 120. Contact pads 122, 123, and 124 are formed in a periphery circuitry region 101f of the third chip 120, with the contact pad 124 of the third chip 120 aligned with the contact pad 104 of the first chip 100, the contact pad 122 of the third chip 120 aligned with the contact pad 112 of the second chip 108, and the contact pad 123 of the third chip 120 aligned with the contact pad 113 of the second chip 108. A grinding process is performed on the third chip 120 after completing the semiconductor element fabrication. The third chip 120 includes a DRAM, a Flash memory, a Logic, or a RF element. The contact pads 122, 123, and 124 include contact pads which are electrically connected to the semiconductor elements in the active circuitry region 101e, or contact pads which are electrically connected to periphery circuitry (not shown) in the periphery circuitry region 101f. Furthermore, by means of an interconnect structure, the contact pads 122, 123, and 124 can be electrically connected to each other, either two of them or all three of them are interconnected.

Reference is made to FIG. 1D, which illustrates formation of openings 126, 127 and 128 in the third chip 120. The opening 126 is formed through the contact pad 122 and a surface of the contact pad 112 is exposed. The opening 127 is formed through the contact pad 123 and a surface of the plug 115a is exposed. The opening 128 is formed through the contact pad 124 and a surface of the plug 116a is exposed. Plugs 126a, 127a, and 128a are then formed in the openings 126, 127, and 128, respectively, and the openings 126, 127, and 128 are all filled.

Thereafter, a method of manufacturing the plugs 126a, 127a, and 128a comprises formation of a conductive layer (not shown) on the third chip 120 and filling the openings 126, 127, and 128. By means of etching back or chemical-mechanical polishing (CMP), parts of the conductive layer are removed until a surface of the third chip 120 is exposed. Hence, the plugs 126a, 127a, and 128a are then formed in the openings 126, 127, and 128, respectively. At this time, the plugs 128a and 116a form a plug 130. The plugs 127a and 115a form a plug 129. The contact pads 112, 113, and 104 are electrically connected to the contact pads 122, 123, and 124 through the plugs 126a, 127a, and 130, respectively.

In other words, the semiconductor elements (not shown) or the periphery circuitry of the second chip 108 can be electrically connected to the third chip 120 by means of the plug 126a. The semiconductor elements (not shown) or the periphery circuitry of the first chip 100 can be electrically connected to the third chip 120 by means of the plug 130. In addition, the semiconductor elements or the periphery circuitry of the first chip 100, the semiconductor elements or the periphery circuitry of the second chip 108, and the semiconductor elements or the periphery circuitry of the third chip 120 can be electrically interconnected by means of the plug 129.

Alternatively, electrical connections between the semiconductor elements or the periphery circuitry of the first chip 100, the semiconductor elements or the periphery circuitry of the second chip 108, and the semiconductor elements or the periphery circuitry of the third chip 120 can be established by the plug 114a, which is electrically connected to the first chip 100 and the second chip 108, the plug 126a, which is electrically connected to the second chip 108 and the third chip 120, and the interconnect structure between the contact pads 110 and 112. Thus, the first chip 100, the second chip 108, and the third chip 120 are electrically interconnected.

Reference is made to FIG. 1E. An I/O bonding pad 134 is fabricated on the third chip 120 which completes a manufacture process of a three-dimensional system-on-chip. A method of forming the I/O bonding pads comprises formation of a protective layer 132 on the third chip 120. The protective layer 132 is then defined to expose part of a surface of the contact pad which is used to make an electrical connection with an outside circuitry (not shown), on which the I/O bonding pad is fabricated. In the embodiment described herein, part of a surface of the contact pad 124 on the third chip 120 is exposed by a patterned protective layer 132, which serves as the I/O bonding pad. However, in real practice, the invention is not limited to exposing only the contact pad 124, and to serving as the only I/O bonding pad, by means of the protective layer 132. Other contact pads can be exposed by the patterned protective layer 132, which serves as the I/O bonding pads, in accordance with actual requirement.

In the embodiment described above, each chip (that is, the first chip, the second chip, and the third chip) is fabricated by its own semiconductor manufacturing process. After that, a grinding process is employed to reduce its thickness and then cut into individual chips. Stacking the chips on each other is accomplished by means of adhesive layers. A conventional interconnect process is then employed to establish electrical connections between the chips. Because the differently functioning chips are formed by their own manufacturing processes, the complexity and the difficulty of manufacturing the system-on-chip can both be reduced. Thus, the yield is higher than in the prior art method of fabricating the system-on-chip, and the production cost is decreased.

Moreover, the conventional interconnect process is employed for the electrical connections between the chips, and the yield of the conventional interconnect process is larger than 95%. Therefore, the yield of fabricating the three-dimensional system-on-chip can be greatly increased in accordance with the present invention.

In addition, the differently functioning chips are not arranged on the same surface in the three-dimensional system-on-chip according to the present invention. Hence, the layout area required for the system-on-chip can be reduced. The complexity and the difficulty for the circuitry layout design can be reduced as well.

In accordance with a preferred embodiment of the present invention, a three-dimensional system-on-chip is fabricated by stacking three pieces of chips (that is, the first chip, the second chip, and the third chip) on each other as an example. However, four or more layers of same chips or different chips can be stacked together according to actual requirements. Furthermore, in the embodiment described above, the electrical connections between the chips are established by means of the contact pads, which are electrically connected to the semiconductor elements in the active circuitry regions, and through the plugs. However, in real practice, the contact pads are not necessarily electrically connected to the semiconductor elements in the active circuitry regions. The contact pads, which are electrically connected to the periphery circuitry in the periphery circuitry regions, can also be employed for establishing electrical connections between two adjacent chips, or two non-adjacent chips, through the plugs.

Method steps of fabricating a three-dimensional system-on-chip according to a preferred embodiment of the present invention comprise the following. A periphery circuitry, which is intended to make electrical connection to other periphery circuitry of corresponding chips, a plurality of contact pads, which are electrically connected to semiconductor elements in an active circuitry region, and a plurality of contact pads, which are electrically connected to the periphery circuitry, are fabricated in a periphery circuitry region of a chip. After completing a grinding process and a cutting process, two chips are then adhered on top of each other by means of a adhesive layer. A conventional interconnect process is employed to establish electrical connections between corresponding contact pads through plugs. Hence, in a three-dimensional system-on-chip of multi-layer stacked chips, the plugs between the chips can be employed to make the electrical connections between two adjacent chips, two non-adjacent chips, or chips stacked more than two layers apart.

The present invention has been disclosed using an exemplary preferred embodiment. However, it is to be understood that the scope of the invention is not limited to the disclosed embodiment. It will be apparent to those skilled in the art that various changes and modifications in the present invention disclosed herein may be made without departing from the scope of the present invention. The scope of the claims, therefore, should be accorded the broadest interpretation so as to encompass all such modifications and similar arrangements.

What is claimed is:

1. A three-dimensional system-on-chip structure, comprising:

a plurality of chips stacked on top of each other, each of the chips having a periphery circuitry region and a plurality of contact pads disposed in each of the periphery circuitry regions; and a plurality of plugs respectively disposed in the periphery circuitry regions of the chips, and passing through the corresponding chips and connecting the contact pads of the corresponding chips so that the corresponding chips are electrically connected to each other, wherein two of the chips adjacent to each other are electrically connected through the plugs and the contact pads, wherein at least one plug that electrically connects the two adjacent chips, including an underlying chip and an overlying chip stacked on the underlying chip, penetrates the corresponding contact pad on the overlying chip and the overlying chip; and by means of the plugs and the contact pads two of the chips which are not adjacent to each other are electrically connected as well.

2. The structure of claim 1, wherein the chips include DRAMs.

3. The structure of claim 1, wherein the chips include Flash memories.

4. The structure of claim 1, wherein the chips include Logics.

5. The structure of claim 1, wherein the chips include RF elements.

6. The structure of claim 1, wherein the corresponding plugs pass through the chip, with some of the corresponding plugs connecting the contact pads of one of the chips to the corresponding contact pads of an adjacent chip.

7. The structure of claim 1 wherein the corresponding plugs pass through the chip, with some of the corresponding plugs of one of the chips only connecting to the corresponding contact pads of an adjacent chip.

8. The structure of claim 1, wherein the corresponding plugs pass through the chip, with some of the corresponding plugs connecting the contact pads of one of the chips to the corresponding plugs of an adjacent chip.

9. The structure of claim 1, wherein the corresponding plugs pass therethrough, with some of the corresponding plugs of one of the chips only connecting to the corresponding plugs of an adjacent chip.

10. A three-dimensional system-on-chip structure, comprising:

a plurality of chips stacked on top of each other, each of the chips having a periphery circuitry region and a plurality of contact pads disposed in each of the periphery circuitry regions;

a plurality of adhesive layers disposed between the chips, each of the adhesive layers alternatively located between the chips; and a plurality of plugs respectively disposed in the periphery circuitry regions of the chips, and passing through the corresponding chips and connecting the contact pads of the corresponding chips so that the corresponding chips are electrically connected to each other, wherein two of the chips adjacent to each other are electrically connected through the plugs and the contact pads, wherein at least one plug that electrically connects the two adjacent chips, including an underlying chip and an overlying chip stacked on the underlying chip, penetrates the corresponding contact pad on the overlying chip and the overlying chip; and by means of the plugs and the contact pads two of the chips which are not adjacent to each other are electrically connected as well.

11. The structure of claim 10, wherein the chips include DRAMs.

12. The structure of claim 10, wherein the chips include Flash memories.

13. The structure of claim 10, wherein the chips include Logics.

14. The structure of claim 10, wherein the chips include RF elements.

15. The structure of claim 10, wherein the corresponding plugs pass through the chip, with some of the corresponding plugs connecting the contact pads of one of the chips to the corresponding contact pads of an adjacent chip.

16. The structure of claim 10, wherein the corresponding plugs pass through the chip, with some of the corresponding plugs only connecting to the corresponding contact pads of the adjacent chips.

17. The structure of claims 10, wherein the corresponding plugs pass through the chip, with some of the corresponding plugs connecting the contact pads of one of the chips to the corresponding plugs of an adjacent chip.

18. The structure of claim 10, wherein the corresponding plugs pass therethrough, with some of the corresponding plugs only connecting to the corresponding plugs of the adjacent chips.

\* \* \* \* \*